(12) United States Patent
Lesea

(10) Patent No.: US 7,535,213 B1
(45) Date of Patent: May 19, 2009

(54) METHOD AND SYSTEM FOR PREDICTION OF ATMOSPHERIC UPSETS IN AN INTEGRATED CIRCUIT

(75) Inventor: Austin H. Lesea, Los Gatos, CA (US)

(73) Assignee: XILINX, Inc., San Jose, CA (US)

( * ) Notice: Subject to any disclaimer, the term of this patent is extended or adjusted under 35 U.S.C. 154(b) by 708 days.

(21) Appl. No.: 11/214,759

(22) Filed: Aug. 29, 2005

(51) Int. Cl.
*G01R 31/28* (2006.01)
(52) U.S. Cl. .................................. 324/158.1
(58) Field of Classification Search .......... 324/763, 324/765, 760, 158.1, 769; 257/48; 438/14–18; 702/15, 182, 188–189; 250/372, 241, 440.11; 365/201
See application file for complete search history.

(56) References Cited

U.S. PATENT DOCUMENTS 5,965,219 A * 10/1999 Hayashi et al. ............. 427/586
7,072,591 B1 * 7/2006 Smith ........................ 398/202

OTHER PUBLICATIONS

Tech Focus Media; *FPGA and Programmable Logic Journal*, "Upset with Neutrons", Apr. 4, 2004, pp. 1-8, availabe from http://www.fpgajournal.com/articles/20040420_seus.htm.

Quinn, Heather M. et al.; "Terrestrial-Based Radiation Upsets: A Cautionary Tale", Apr. 17, 2005, pp. 1-10 available from Los Alamos National Laboratory P.O. Box 1663, Los Alamos, NM 87545.
Lesea, Austin, et al., "The Rosetta Experience: Atmosperic Soft Error Rate Testing in Differing Technology FPGAs", IEEE Transactions on Device and Materials Reliablity, vol. 5, No. 3, Sep. 2005, pp. 317-328.
Lesea, Austin H. et al., A Thousand Years Between Single-Event Upset Failures Feb. 3, 2003, pp. 1-2, available from Xilinx, Inc., 2100 Logic Drive, San Jose, CA 95124.
Fabula, Joseph J. et al., "The NSEU Response of Static Latch Based FPGAs", 2003, available from Xilinx, Inc., 2100 Logic Drive, San Jose, CA 95124.

* cited by examiner

*Primary Examiner*—Ha Tran T Nguyen
*Assistant Examiner*—Tung X Nguyen
(74) *Attorney, Agent, or Firm*—LeRoy D. Maunu; Justin Liu

(57) ABSTRACT

Prediction of a rate of atmospheric upsets in an integrated circuit (IC) is described. In one embodiment, a first rate of atmospheric upsets is measured in a plurality of ICs of a first type. Within a beam of atomic particles, a second rate of beam upsets of at least one IC of the first type and a third rate of beam upsets of at least one IC of a second type are concurrently measured. A fourth rate of atmospheric upsets is determined in an IC of the second type as a function of the first rate of atmospheric upsets and the second and third rates of beam upsets.

17 Claims, 4 Drawing Sheets

METHOD AND SYSTEM FOR PREDICTION OF ATMOSPHERIC UPSETS IN AN INTEGRATED CIRCUIT

FIELD OF THE INVENTION

The present invention generally relates to soft failures in integrated circuits due to, for example, cosmic radiation.

BACKGROUND

The normal processing of information by an integrated circuit (IC) may be upset by atmospheric disturbances. During the normal processing of information by an IC, outputs may be generated at pins of the IC from internally stored state and from inputs received at pins of the IC. An atmospheric upset may cause corruption of the internally stored state, for example, the value stored in a bit of the internal state may be inverted from the proper value for normal operation. The inverted bit of internal state may immediately or subsequently cause improper outputs to be generated at the pins of the IC. An atmospheric upset may be a soft failure that disrupts normal operation temporarily, and normal operation of the IC may be restored following, for example, a reset of the IC.

Example causes of atmospheric upsets include cosmic radiation and high-energy atomic particles from radioactive decay. An atomic particle of cosmic radiation from outer space may enter the Earth's atmosphere and collide with an atom above the IC. This collision and a cascade of subsequent secondary collisions may release a narrow stream of atomic particles including electrically charged atomic particles. The narrow stream of atomic particles may impact a memory or register cell for a bit of the internal state of the IC and deliver enough electric charge to the cell to invert the value stored in the cell from the proper value for normal operation.

The disruption of normal operation by atmospheric upsets affects the reliability of the IC. During the design of an IC, various design alternatives may affect the ultimate susceptibility of the subsequently fabricated IC to atmospheric upsets. Achieving the target reliability for the IC may require an appropriate selection of design alternatives. Further, users of the IC may request an accurate reliability specification. However, generating an accurate reliability specification may be delayed because of the time necessary to collect data for a statistically significant number of atmospheric upsets.

The present invention may address one or more of the above issues.

SUMMARY OF THE INVENTION

The various embodiments of the invention provide for determining a predicted rate of atmospheric upsets in an integrated circuit (IC). In one embodiment, a first rate of atmospheric upsets is measured in a plurality of ICs of a first type. Within a beam of atomic particles, a second rate of beam upsets of at least one IC of the first type and a third rate of beam upsets of at least one IC of a second type are concurrently measured. A fourth rate of atmospheric upsets is determined in an IC of the second type as a function of the first rate of atmospheric upsets and the second and third rates of beam upsets.

In another embodiment, a method for determining a predicted rate of atmospheric upsets in an IC includes measuring a first rate of atmospheric upsets in a plurality of ICs of a first type, and measuring, in a beam of atomic particles, a second rate of beam upsets of at least one IC of the first type concurrently with a third rate of beam upsets of at least one IC of a second type. Respective critical charges of the first and second types of IC and a third type of IC are simulated, and a fourth rate of atmospheric upsets in an IC of the third type is generated as a function of the first rate of atmospheric upsets, the second and third rates of beam upsets, and the respective critical charges of the first, second, and third types of IC.

A system for determining a predicted rate of atmospheric upsets in an IC is provided in another embodiment. The system includes first, second, and third subsystems. The first subsystem measures a first rate of atmospheric upsets from a plurality of ICs of a first type. The second subsystem is adapted to measure a second rate of beam upsets for at least one IC of the first type concurrently with a third rate of beam upsets for at least one IC of a second type. The second subsystem includes a generator of a beam of atomic particles and a control circuit. The least one IC of the first type and the at least one IC of a second type may be disposed within the beam of atomic particles. The control circuit counts a first number of beam upsets in the at least one IC of the first type during a time interval and counts a second number of beam upsets in the at least one IC of the second type during the time interval. The third subsystem is coupled to the first and second subsystems and determines a fourth rate of atmospheric upsets in an IC as a function of the first rate of atmospheric upsets and the second and third rates of beam upsets.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
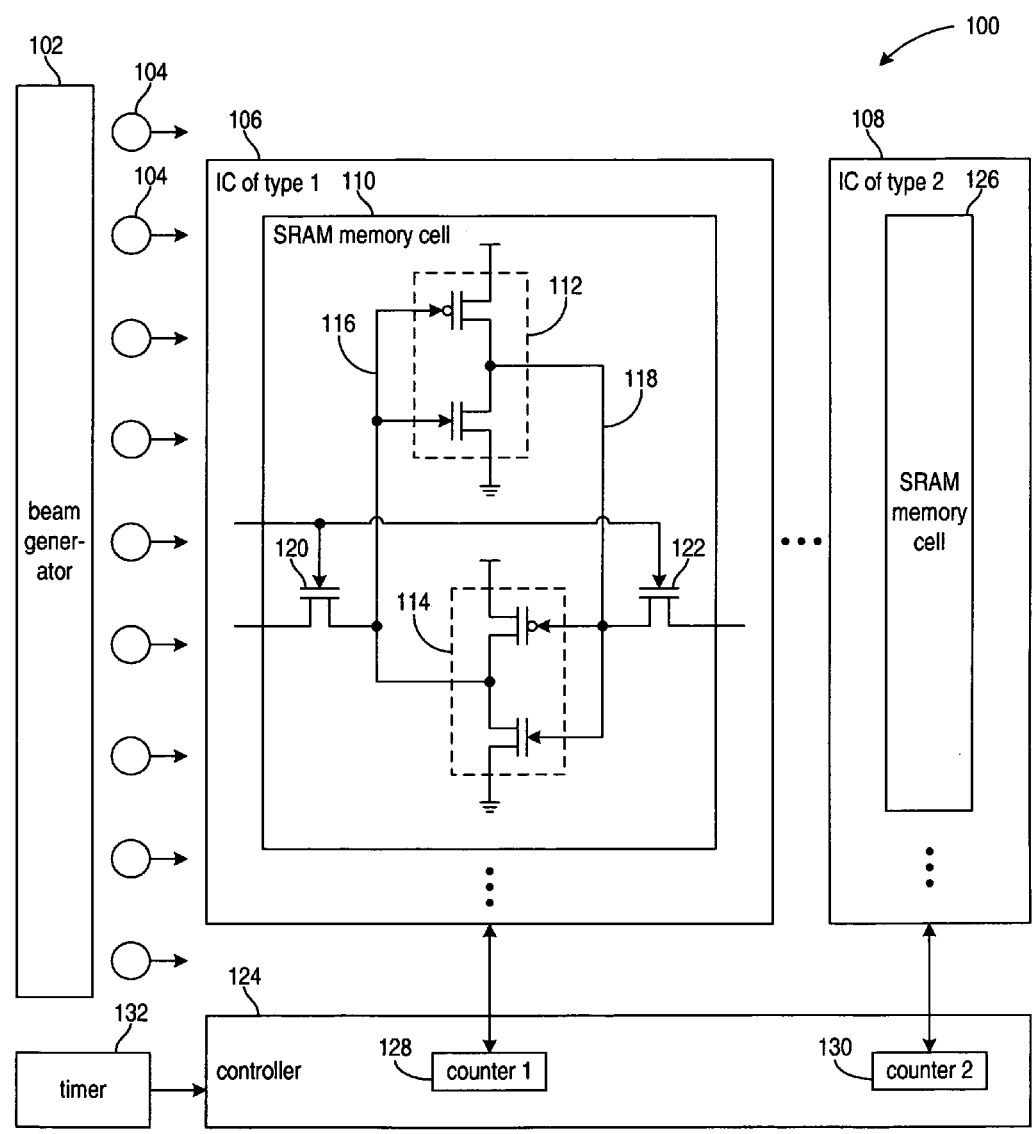
FIG. 1 is a block diagram of a subsystem for concurrently measuring a rate of beam upsets in two types of ICs in accordance with various embodiments of the invention.

FIG. 1 is a block diagram of a subsystem 100 for concurrently measuring a rate of beam upsets in two types of ICs in accordance with various embodiments of the invention. A generator 102, such as a linear accelerator, produces a beam of atomic particles 104, such as neutrons. IC 106 of type-1 and IC 108 of type-2 are disposed within the beam of atomic particles 104. A predicted rate of atmospheric upsets for ICs of type-2 may be determined from a known rate of atmospheric upsets for ICs of type-1 and the measured rates of beam upsets for ICs 106 and 108. In one embodiment, the known rate of atmospheric upsets for ICs of type-1 is multiplied by the ratio of the rate of beam upsets for IC 108 of type-2 and the rate of beam upsets for IC 106 of type-1 to predict the rate of atmospheric upsets for ICs of type-2.

A stream of secondary atomic particles generated following a collision between one of atomic particles 104 and an atom in IC 106 or the environment of IC 106 may upset a state bit stored in SRAM memory cell 110 of IC 106. The stream of secondary atomic particles may inject enough charge into the SRAM memory cell 110 to invert the value of the state bit stored in the cross-coupled inverters 112 and 114 of SRAM memory cell 110. For example, in one state the node on line 116 may have a high value and the node on line 118 may have a low value, and one of atomic particles 104 may generate a stream of free electrons that are captured by the node on line 116. The captured electrons may discharge the node on line 116 to a low value, causing inverter 112 to drive a high value on line 118, further causing inverter 114 to reinforce the low value of the node on line 116. Thus, the state bit stored in SRAM memory cell 110 is inverted. Other types of circuits that are sensitive to atmospheric upsets, such as latches or registers, may also be included in ICs 106 and 108, either in addition to or in place of the SRAM cells, in various embodiments of the present invention.

The rate of beam upsets for ICs 106 and 108 may be modeled as the flux of the beam of atomic particles 104 multiplied by a respective cross-sectional area for the ICs. The beam flux may be quantified as the number of atomic particles 104 per unit of area per second. The beam of atomic particles 104 may interact very weakly with the ICs 106 and 108, such that only a small fraction of the atomic particles 104 cause upsets of the SRAM memory cells of ICs 106 and 108. The cross-sectional area for IC 106 may depend on the geometry of the circuits of SRAM memory cell 110 and the number of SRAM memory cells in IC 106.

The susceptibility of ICs 106 and 108 to beam upsets may be provided by their respective cross-sectional areas, and the relative susceptibility to beam upsets between ICs 106 and 108 may be provided by the ratio of their cross-sectional areas. Generally, the susceptibility to beam upsets of ICs having the type-1 of IC 106 is provided by the cross-sectional area of representative IC 106. Similarly, the susceptibility to beam upsets of ICs having the type-2 of IC 108 is provided by the cross-sectional area of representative IC 108. The susceptibility may vary depending upon the type of atomic particles 104, such as neutrons, protons, and ions, and the energy of these atomic particles. However, the relative susceptibility to beam upsets between ICs 106 and 108 may accurately reflect the relative susceptibility to atmospheric upsets between ICs 106 and 108.

In one embodiment, the beam generator 102 may produce a beam of atomic particles 104 with a flux that varies by approximately 20 percent between tests. Thus, an existing procedure that uses separate tests to determine the respective rates of beam upsets for two types of ICs may require accurate measurement of the flux to determine the cross-sectional area for the two types of ICs and to determine the relative susceptibility of the two types of ICs as provided by the ratio of the cross-sectional areas for the two types of ICs. Flux measurement may introduce additional error in the accuracy of the relative susceptibility to beam upsets for the two types of ICs. If the flux is not measured, the relative susceptibility may have an accuracy that is limited by the variation of the flux between tests.

In contrast, various embodiments of the invention concurrently measure the rates of beam upsets for two or more types of ICs in a single test. In one embodiment, the ICs 106 and 108 are arranged such that the beam of atomic particles 104 passes first through IC 106 and then through IC 108 with the beam passing through each IC 106 and 108 in direction that is a generally perpendicular to the surface of these ICs. Because the beam of atomic particles 104 interacts very weakly with IC 106, the flux may be essentially identical for ICs 106 and 108. In another embodiment, the ICs 106 and 108 are arranged adjacent to each other within the beam, which may have a constant flux through the area of ICs 106 and 108. Thus, measurement of the flux is not necessary to determine the relative susceptibility between the two ICs 106 and 108. The relative susceptibility between the two ICs 106 and 108 is the ratio of the rates of beam upsets for the two ICs 106 and 108. In one embodiment, the accuracy of the relative susceptibility to beam upsets provided by the ratio of the rates of beam upsets is approximately 1 percent (i.e., within 1 percent of the actual value), and the relative susceptibility to atmospheric upsets provided by this ratio is also approximately 1 percent.

A controller 124 may repeatedly read the state of each SRAM memory cell, including SRAM memory cell 110 of IC 106 and SRAM memory cell 126 of IC 108, and check the state of each SRAM memory cell for corruption. Read and write access to the state bit stored in SRAM memory cell 110 may be provided, for example, by transistors 120 and/or 122. Each upset of an SRAM memory cell in IC 106 may be counted in counter-1 128 and each upset of an SRAM memory cell in IC 108 may be concurrently counted in counter-2 130 over a time interval provided by timer 132. The relative susceptibility to beam upsets between ICs 106 and 108 may be provided by the ratio of the number of upsets counted in counter-1 128 and the number of upsets counted in counter-2 130. Generally, the relative susceptibility between ICs having the type-1 of IC 106 and ICs having the type-2 of IC 108 may be provided by the ratio of upsets counted in counters 128 and 130. In one embodiment, the time interval is approximately one hour to count a statistically significant number of upsets, such that the relative susceptibility to beam upsets between an IC having the type-1 of IC 106 and an IC having the type-2 of IC 108 may be quickly determined to an accuracy of approximately 1 percent.

The type-1 IC 106 may be a previously developed IC from a mature fabrication process and the type-2 IC 108 may be a prototype of a newly developed IC from a recently developed fabrication process. A measured rate of atmospheric upsets may be available for the older type-1 IC 106. In one embodiment, a period of one or more years is required to count enough atmospheric upsets to measure a rate of atmospheric upsets with an accuracy of approximately 10 percent, since radiation in atmospheric conditions is relatively low. Thus, to measure the rate of atmospheric upsets for newly developed IC 108 may require a period of one or more years after prototypes of the IC 108 become available. Certain embodiments of the invention quickly predict the rate of atmospheric upsets for newly developed IC 108 as soon as the relative susceptibility to beam upsets between ICs 106 and 108 is measured using subsystem 100. The rate of atmospheric upsets for newly developed IC 108 is predicted by scaling the rate of atmospheric upset for previously developed IC 106, which is known, by the relative susceptibility to beam upsets for ICs 106 and 108. In one embodiment, the predicted rate of atmospheric upsets for newly developed IC 108 is found to have an accuracy of 10 percent (i.e., approximately the same accuracy as the rate of atmospheric upsets for previously developed IC 106).

Figure 2:
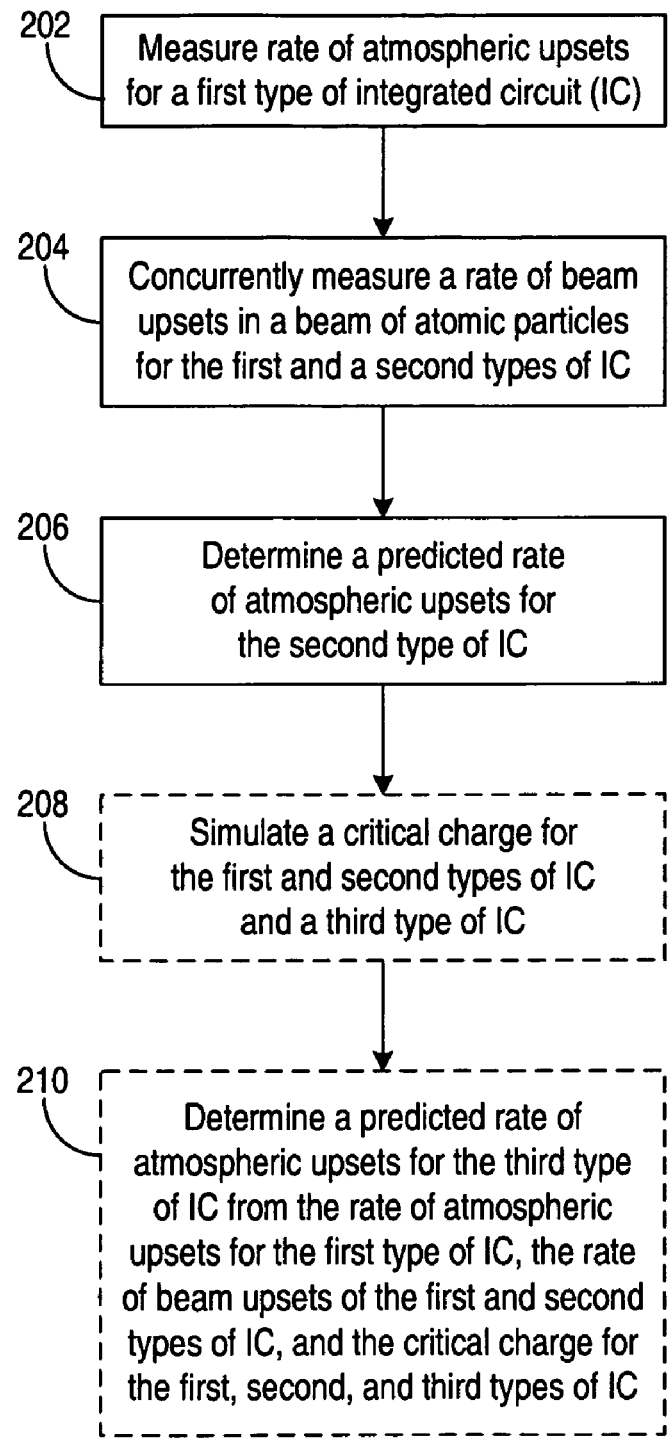
FIG. 2 is a flow chart of a process for predicting a rate of atmospheric upsets for an IC in accordance with various embodiments of the invention.

FIG. 2 is a flow chart of a process for predicting a rate of atmospheric upsets for an IC in accordance with various embodiments of the invention. Atmospheric upsets may be infrequent events, such that directly measuring atmospheric upsets may take a period of one or more years. A generated beam of atomic particles with a high flux may allow quick measurement of beam upsets, and concurrent measurement of beam upsets for multiple types of ICs may permit rapid and accurate prediction of the rate of atmospheric upsets for an IC.

At step 202, the rate of atmospheric upsets is measured or otherwise determined (e.g., taken from published or known results) for a first type of IC. The measurement of atmospheric upsets may take a period of one or more years using hundreds to thousands of the first type of IC. In certain embodiments, the rate of atmospheric upsets is measured at various altitudes above sea level. Generally, the rate of atmospheric upsets increases with increasing altitude within the atmosphere of the Earth. It will be appreciated that measurement of the rate of atmospheric upsets at a particular altitude may use interpolation and/or extrapolation of the measured rate of atmospheric upsets at multiple altitudes. In addition, the rate of atmospheric upsets may be measured for more than one type of IC.

At step 204, the rate of beam upsets is concurrently measured for the first type of IC and a second type of IC. A beam of atomic particles may be generated and one or more representative ICs of each of the first and second types may be positioned within the beam of atomic particles. Over a particular time interval, the number of upsets may be counted in each IC. The total number of upsets in ICs of the first type divided by the number of ICs of the first type and by the length of the time interval may provide the rate of beam upsets for an IC of the first type. The rate of beam upsets for an IC of the second type may similarly be provided. Because the upsets are concurrently counted during the particular time interval, any variation in the flux during the particular time interval may equally affect each IC. Thus, advantageously, measurement of the beam flux is not needed. It will be appreciated that the rate of beam upsets may be concurrently measured for more than two types of IC.

At step 206, a predicted rate of atmospheric upsets is determined for the second type of IC. In one embodiment, the rate of atmospheric upsets in an IC of the second type is predicted from the rate of atmospheric upsets measured in step 202 for the first type of IC and the rates of beam upsets concurrently measured in step 204 for the first and second types of IC. The rate of atmospheric upsets in an IC of the second type may be predicted as the rate of atmospheric upsets in the first type of IC multiplied by the ratio of the rate of beam upsets for the second type of IC and the rate of beam upsets for the first type of IC. In another embodiment, prediction of a rate of atmospheric upsets of the second type of IC may use extrapolation and/or interpolation of trends for the rates of atmospheric upsets for at least two types of IC measured at step 202 and rates of beam upsets for at least three types of IC measured at step 204. In some embodiments, using more than two types of IC may further increase accuracy of the predicted rate of atmospheric upsets.

At optional step 208, a critical charge is simulated for the first and second types of IC and a third type of IC. In one embodiment, a respective SPICE simulation for each type of IC simulates a current source injecting a current pulse into a storage node of an SRAM memory cell. Each simulated SRAM memory cell may have circuit parameters that are extracted from a layout of the SRAM memory cell in the corresponding type of IC. An example storage node of an SRAM memory cell is the node on line 116 of SRAM memory cell 110 of FIG. 1. The critical charge is the amount of charge delivered to the SRAM memory cell by a current pulse that is just sufficient to corrupt the state bit stored in the SRAM memory cell. In one embodiment, the current pulse has a rise time of 5 picoseconds and a fall time of 30 picoseconds, and the critical charge may be determined from the peak amplitude of the current pulse.

At optional step 210, a predicted rate of atmospheric upsets is determined for the third type of IC from the rate of atmospheric upsets for the first type of IC, the rates of beam upsets for the first and second types of IC, and the critical charges for the first, second, and third types of IC. In one embodiment, the rate of atmospheric upsets is predicted for the third type of IC as the rate of atmospheric upsets for the first type of IC multiplied by the ratio of the critical charge of the third IC and the critical charge of the first IC. In another embodiment, the rate of atmospheric upsets for the third type of IC is the predicated rate of atmospheric upsets for the second type of IC multiplied by the ratio of the critical charge of the third IC and the critical charge of the second IC, with the predicated rate of atmospheric upsets for the second type of IC being the rate of atmospheric upsets for the first type of IC multiplied by the ratio of the rate of beam upsets for the second IC and the rate of beam upsets of the first IC. In yet another embodiment, extrapolation and/or interpolation of trends in the rate of atmospheric upsets for the first type of IC, the rates of beam upsets for the first and second types of IC, and the critical charges for the first, second, and third types of IC are used to predict the rate of atmospheric upsets for the third type of IC.

In one embodiment, the first, second, and third types of ICs are successive generations of programmable logic devices (PLDs), each implemented in successive generations of IC fabrication processes. The development of the third type of IC may begin when prototypes of the second type of IC are newly available and when the first type of IC has been available for a sufficient period of time to measure the rate of atmospheric upsets at step 202. The rate of beam upsets for ICs of the first type and the newly available ICs of the second type may be concurrently measured at step 204, and used to predict the rate of atmospheric upsets for the second type of IC at step 206 with an accuracy that matches the approximately 10 percent accuracy of the rate of atmospheric upsets for the first type of IC. The trend in the rates of atmospheric upsets for the first and second types of IC may be compared with the trend in the critical charges from step 208 for the first, second, and third types of IC to predict the rate of atmospheric upsets for the third type of IC with an accuracy approaching approximately 10 percent. Thus, the rate of atmospheric upsets for the third type of IC may be accurately predicted during initial development (e.g., prior to any actual fabrication of devices), when design modifications for the third type of IC may be readily made to achieve the targeted rate of atmospheric upsets for the third type of IC.

It will be appreciated that the accuracy of the predicted rate of atmospheric upsets for the third type of IC may be improved when rates of atmospheric upsets, concurrently measured rates of beam upsets, and critical charges are available for one or more generations of ICs before the first type of IC.

Figure 3:
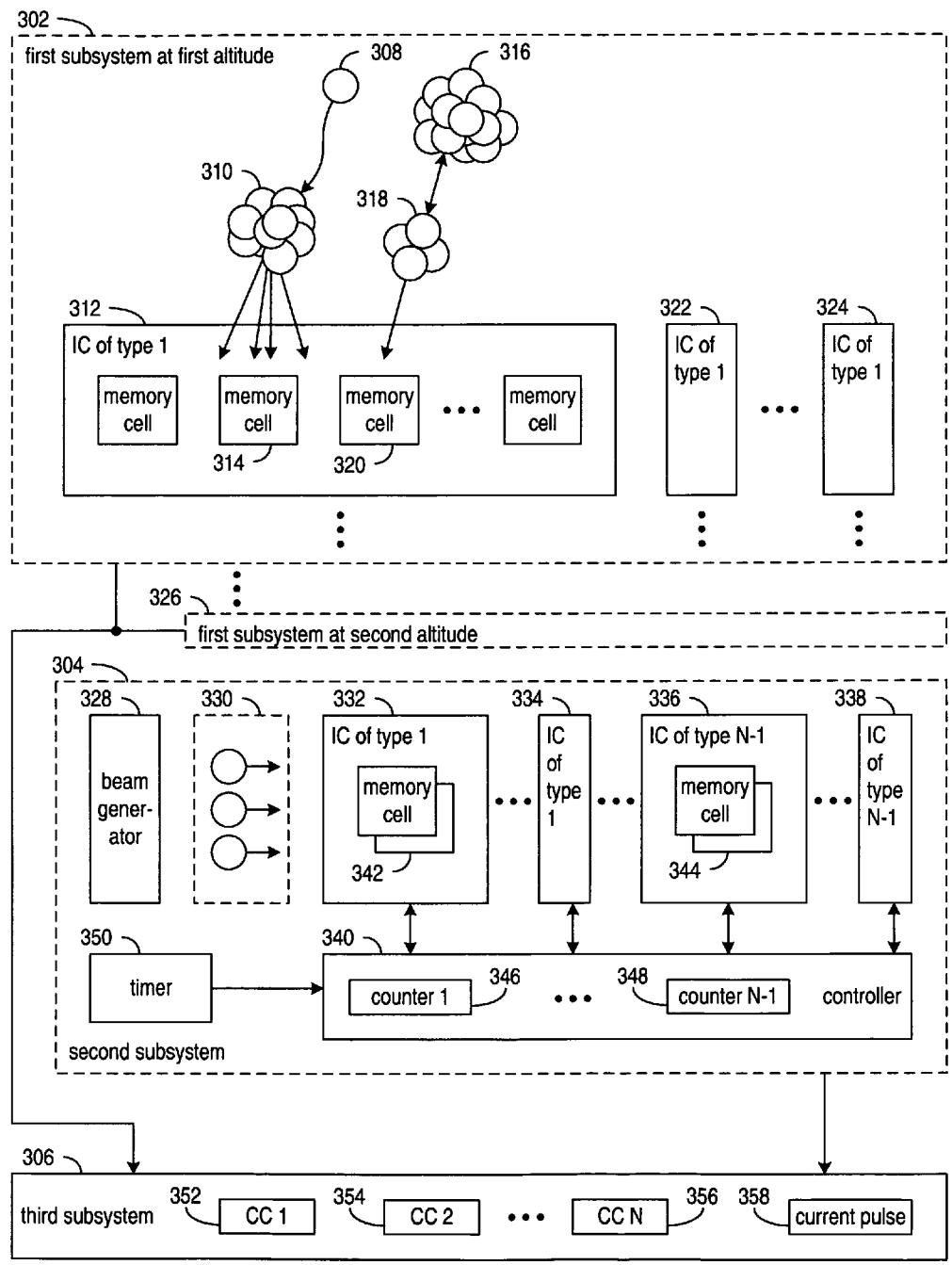
FIG. 3 is a block diagram of a system for predicting the rate of atmospheric upsets in an IC in accordance with various embodiments of the invention.

FIG. 3 is a block diagram of a system for predicting the rate of atmospheric upsets in an IC in accordance with various embodiments of the invention. A first subsystem 302 measures a rate of atmospheric upsets for at least a type-1 IC. A second subsystem 304 concurrently measures a rate of beam upsets for at least the type-1 IC and a type-2 IC. A third subsystem 306 simulates a critical charge of at least the type-1, the type-2, and a type-3 IC. The third subsystem 306 is at least one general purpose computing system that predicts the rate of atmospheric upsets of at least a type-N IC, with N being at least three.

Cosmic radiation 308 may collide with an atom 310 in an IC 312 or in the environment of IC 312. The collision between cosmic radiation 308 and atom 310 may release a stream of atomic particles that causes an atmospheric upset corrupting the state bit stored in memory cell 314 of IC 312. Similarly, radioactive decay of atom 316 in IC 312 or in the environment of IC 312 may release a high-energy atomic particle, such as alpha particle 318. Alpha particle 318 may directly or indirectly cause an atmospheric upset corrupting the state bit stored in memory cell 320 of IC 312.

The first subsystem 302 measures a rate of atmospheric upsets for at least a type-1 IC. To increase to frequency of observing atmospheric upsets, the first subsystem 302 may include any number of ICs, such as 100 to 1000 ICs, 312, 322, and 324 of type-1. Subsystem 302 may measure atmospheric upsets for ICs of type-1 (312, 322, and 324) through type-(N−2) (not shown). Multiple first subsystems 302 and 326 may be used to measure rates of atmospheric upsets at multiple altitudes relative to sea level.

Rates of beam upsets are concurrently measured for at least the type-1 and the type-2 ICs using the second subsystem 304. A beam generator 328 may generate a beam 330 of atomic particles, such as neutrons, protons, or atomic ions. One or more ICs 332 and 334 of type-1 through one or more ICs 336 and 338 of type N−1 may be positioned within the beam 330 of atomic particles. A controller 340 may repeatedly read the values of memory cells 342 in the ICs 332 and 334 of type-1 and the memory cells 344 in the ICs 336 and 338 of type N−1, and concurrently count the number of upsets for each type of IC in corresponding counters 346 through 348 during a time interval provided by timer 350.

The third subsystem 306 may perform calculations to predict the rate of atmospheric upsets for an IC of one or more types type-2 through type-N. The critical charges 352, 354, and 356 of type-1 through type-N ICs may be simulated using the third subsystem 306, which may be a general purpose computer. The simulation of the critical charges 352, 354, and 356 may determine the charge delivered by a current pulse 358 that is just sufficient to corrupt the state stored in a memory cell of the corresponding type of IC. The third subsystem 306 may predict the rate of atmospheric upsets for ICs of types type-2 through type-N using the measured rate of atmospheric upsets of type-1 through type N−2 ICs, the measured rate of beam upsets of type-1 through type N−1 ICs, and the simulated critical charge for type-1 through type-N ICs.

Figure 4:
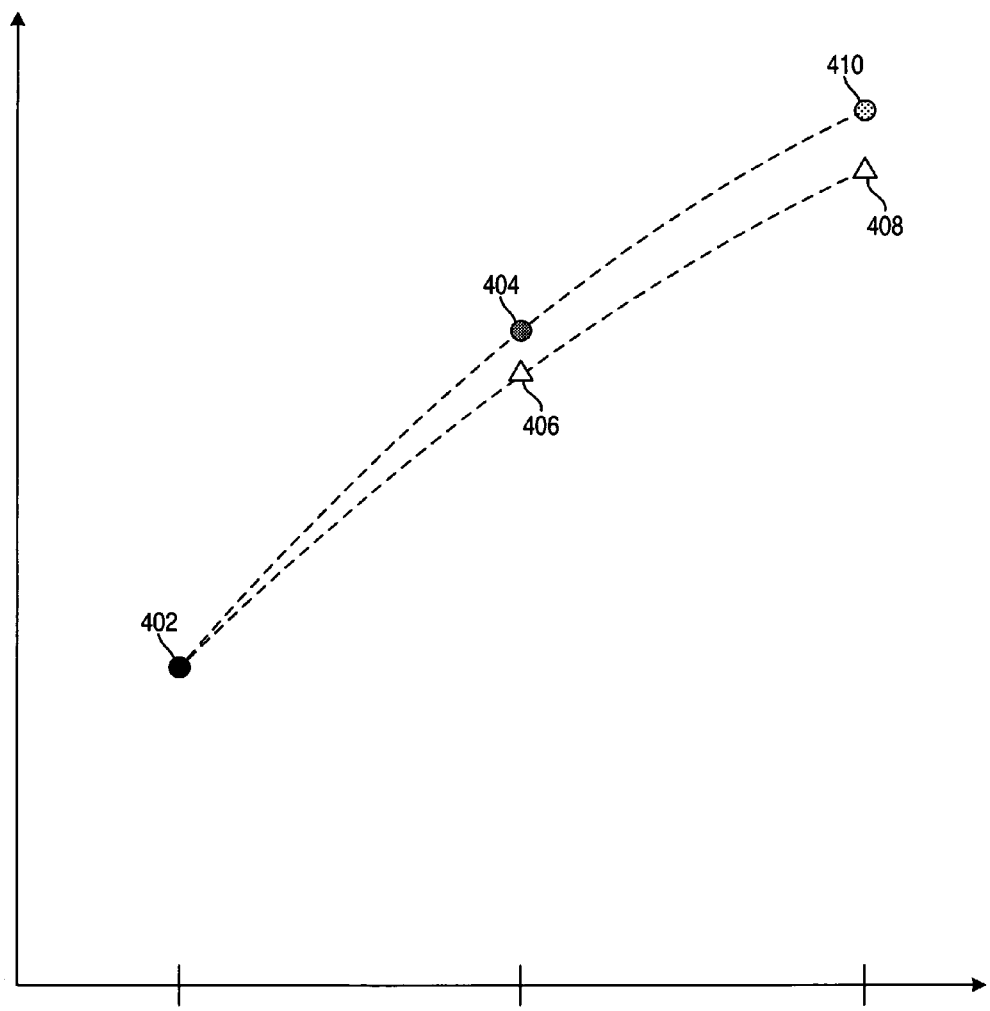
FIG. 4 is a plot illustrating extrapolation of trends in the rate of atmospheric upsets in accordance with various embodiments of the invention.

FIG. 4 is a plot illustrating extrapolation of trends in the rate of atmospheric upsets in accordance with various embodiments of the invention. The horizontal axis may be a generation number for successive generations of IC types. Alternatively, the horizontal axis may be a date of initial production of each generation of IC types, or the inverse of a minimum feature size of the fabrication process for the IC types. The vertical axis is the rate of atmospheric upsets that is either measured or predicted.

A first generation of ICs has a measured rate 402 of atmospheric upsets. The measured rate of atmospheric upsets may be measured on 100 to 1000 of the first generation ICs over a period of one or more years to achieve an accuracy of approximately 10 percent. A predicted rate 404 of atmospheric upsets for a second generation of ICs may be generated by scaling the measured rate 402 of atmospheric upsets for the first generation of ICs by a ratio of a measured rate of beam upsets for the second generation of ICs and a measured rate of beam upsets for the first generation of ICs. An alternative predicted rate 406 of atmospheric upsets for the second generation of ICs may be generated by scaling the measured rate 402 of atmospheric upsets for the first generation of ICs by a ratio of a critical charge for the second generation of ICs and a critical charge of the first generation of ICs. Both predicted rates 404 and 406 for the second generation of ICs may have an accuracy of approximately 10 percent; the difference between predicted rates 404 and 406 is exaggerated for purposes of illustration.

A third generation of ICs has the alternative predicted rate 408 of atmospheric upsets that is a scaling of the predicted rate 404 of atmospheric upsets for the second generation of ICs by the ratio of the critical charge of the third generation of ICs and the critical charge of the second generation of ICs. Predicted rate 410 of atmospheric upsets for the third generation of ICs may be generated by extrapolating the trend in the difference between the predicted rates 406 and 404 for the second generation of ICs to corresponding predicted rates 408 and 410 for the third generation of ICs. In one embodiment, the difference between predicted rates 406 and 404 for the second generation of ICs is doubled, and this doubled difference is added to the predicted rate 408 for the third generation of ICs to yield the predicted rate 410 for the third generation of ICs. The predicted rate 410 for the third generation of ICs may have an accuracy of approximately 10 percent.

It will be appreciated that other processes may be used to extrapolate the trends in the measured and predicted rates of atmospheric upsets. For example, measured and predicted rates of atmospheric upsets may be available for generations of ICs prior to the first generation of ICs, and various curve-fitting algorithms may be used to extrapolate the trends in the measured and predicted rates of atmospheric upsets.

What is claimed is:

1. A method for determining a predicted rate of atmospheric upsets in an integrated circuit (IC), comprising:
   measuring a first rate of atmospheric upsets in a plurality of ICs of a first type;
   measuring, in a beam of atomic particles, a second rate of beam upsets of at least one IC of the first type concurrently with a third rate of beam upsets of at least one IC of a second type; and
   determining a fourth rate of atmospheric upsets in an IC of the second type as a function of the first rate of atmospheric upsets and the second and third rates of beam upsets.

2. The method of claim 1, wherein the determining the fourth rate of atmospheric upsets includes multiplying the first rate of atmospheric upsets by a ratio of the third rate of beam upsets and the second rate of beam upsets.

3. The method of claim 1, wherein the measuring the first rate of atmospheric upsets includes measuring the first rate of atmospheric upsets in the ICs of the first type at a particular altitude relative to sea level.

4. The method of claim 1, further comprising measuring respective first rates of atmospheric upsets in the ICs of the first type at a plurality of altitudes relative to sea level, and determining for each of the altitudes, respective fourth rates of atmospheric upsets in the IC of the second type as a function of the respective first rates and the second and third rates of beam upsets.

5. The method of claim 1, wherein the atmospheric upsets in the ICs of the first type are caused by at least one selected from the group consisting of cosmic radiation from outer space and atomic particles from radioactive decay.

6. The method of claim 1, wherein the measuring in the beam of particles includes counting a respective number of beam upsets in each IC of the first type during a time interval and counting a respective number of beam upsets in each IC of a second type during the time interval.

7. The method of claim 1, wherein the beam of atomic particles is a beam of at least one selected from the group consisting of neutrons, protons, and ions.

8. The method of claim 1, wherein the plurality of ICs of the first type is at least 100 ICs of the first type.

9. The method of claim 1, wherein the at least one IC of the first type and the at least one IC of the second type are disposed within the beam of atomic particles.

10. The method of claim 1, further comprising:
   simulating respective critical charges of the first and second types of IC and a third type of IC; and
   generating a fifth rate of atmospheric upsets in an IC of the third type as a function of the first rate of atmospheric upsets, the second and third rates of beam upsets, and the respective critical charges of the first, second, and third types of IC.

11. The method of claim 10, wherein the simulating of each critical charge includes simulating a current pulse that inverts a state of a static random access memory (SRAM) cell.

12. A method for determining a predicted rate of atmospheric upsets in an integrated circuit (IC), comprising:
   measuring a first rate of atmospheric upsets in a plurality of ICs of a first type;
   measuring, in a beam of atomic particles, a second rate of beam upsets of at least one IC of the first type concurrently with a third rate of beam upsets of at least one IC of a second type;
   simulating respective critical charges of the first and second types of IC and a third type of IC; and
   generating a fourth rate of atmospheric upsets in an IC of the third type as a function of the first rate of atmospheric upsets, the second and third rates of beam upsets, and the respective critical charges of the first, second, and third types of IC.

13. The method of claim 12, wherein the plurality of ICs of the first type is at least 100 ICs of the first type.

14. The method of claim 12, wherein the at least one IC of the first type and the at least one IC of a second type are disposed within the beam of atomic particles.

15. The method of claim 12, wherein the simulating of each critical charge includes simulating a current pulse that inverts a state of a static random access memory (SRAM) cell.

16. The method of claim 12, wherein the determining the fourth rate of atmospheric upsets includes multiplying the first rate of atmospheric upsets by a ratio of the critical charge of the third type of IC and the critical charge of the first type of IC.

17. The method of claim 12, wherein the determining the fourth rate of atmospheric upsets includes extrapolating trends in the first rate of atmospheric upsets, the second and third rates of beam upsets, and the respective critical charges of the first, second, and third types of IC.

* * * * *